(12) United States Patent　　(10) Patent No.:　US 12,660,201 B2

Zhu et al.　　(45) Date of Patent:　Jun. 16, 2026

(54) SEMICONDUCTOR DEVICE HAVING FERROELECTRIC OR NEGATIVE CAPACITOR AND METHOD OF MANUFACTURING THE SAME, AND ELECTRONIC DEVICE

(71) Applicant: Institute of Microelectronics, Chinese Academy of Sciences, Beijing (CN)

(72) Inventors: Huilong Zhu, Poughkeepsie, NY (US); Weixing Huang, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 536 days.

(21) Appl. No.: 17/906,944

(22) PCT Filed: Apr. 15, 2021

(86) PCT No.: PCT/CN2021/087481

§ 371 (c)(1),
(2) Date: Sep. 21, 2022

(87) PCT Pub. No.: WO2022/048159

PCT Pub. Date: Mar. 10, 2022

(65) Prior Publication Data

US 2024/0306396 A1　　Sep. 12, 2024

(30) Foreign Application Priority Data

Sep. 7, 2020　(CN) .......................... 202010932030.1

(51) Int. Cl.
*H10B 53/30*　　(2023.01)
*H10B 51/30*　　(2023.01)
(Continued)

(52) U.S. Cl.
CPC ............. *H10B 53/30* (2023.02); *H10B 51/30* (2023.02); *H10D 30/024* (2025.01);
(Continued)

(58) Field of Classification Search
CPC .......... H10B 53/30; H10B 51/30; H10D 1/68; H10D 84/813; H10D 30/024;
(Continued)

(56) References Cited

U.S. PATENT DOCUMENTS

2003/0235067 A1* 12/2003 Sakai ...................... G11C 11/22
365/145

FOREIGN PATENT DOCUMENTS

| CN | 105789313 A | | 7/2016 |
|---|---|---|---|
| CN | 112018185 A | | 12/2020 |
| JP | 07202138 A | * | 8/1995 |

OTHER PUBLICATIONS

"International Application Serial No. PCT/CN2021/087481, International Search Report dated Jul. 7, 2021", w/ English Translation, (Jul. 7, 2021), 5 pgs.

(Continued)

*Primary Examiner* — Britt Hanley
*Assistant Examiner* — Jason James Greaving
(74) *Attorney, Agent, or Firm* — Schwegman Lundberg & Woessner, P.A.

(57)　　　　　　ABSTRACT

A semiconductor device having a ferroelectric/negative capacitor and a method of manufacturing the same, and an electronic device including the semiconductor device are provided. According to the embodiments, the semiconductor device may include: a gate electrode and a source/drain electrode formed on a substrate; a positive capacitor formed on the substrate, a first terminal of the positive capacitor being electrically connected to the gate electrode; a ferroelectric or negative capacitor formed on the substrate, a first terminal of the ferroelectric or negative capacitor being electrically connected to the gate electrode, wherein a second terminal of one of the positive capacitor and the ferroelectric or negative capacitor is electrically connected to a gate voltage application terminal, and a second terminal (Continued)

of the other of the positive capacitor and the ferroelectric or negative capacitor is electrically connected to the source/drain electrode.

14 Claims, 9 Drawing Sheets

(51) Int. Cl.

| | | |
|---|---|---|
| *H10D 30/01* | (2025.01) | |
| *H10D 30/62* | (2025.01) | |
| *H10D 30/67* | (2025.01) | |
| *H10D 62/10* | (2025.01) | |
| *H10D 84/80* | (2025.01) | |

(52) U.S. Cl.
CPC ..... *H10D 30/6211* (2025.01); *H10D 30/6219* (2025.01); *H10D 30/6729* (2025.01); *H10D 30/6735* (2025.01); *H10D 62/121* (2025.01); *H10D 84/813* (2025.01)

(58) Field of Classification Search
CPC ........... H10D 30/6211; H10D 30/6219; H10D 30/6729; H10D 30/6735; H10D 62/121; H10D 30/62; H10D 30/021; H10D 30/60; G11C 11/22; G11C 11/221
See application file for complete search history.

(56) References Cited

OTHER PUBLICATIONS

"International Application Serial No. PCT/CN2021/087481, Written Opinion dated Jul. 7, 2021", (Jul. 7, 2021), 4 pgs.

* cited by examiner

SEMICONDUCTOR DEVICE HAVING FERROELECTRIC OR NEGATIVE CAPACITOR AND METHOD OF MANUFACTURING THE SAME, AND ELECTRONIC DEVICE

CROSS REFERENCE TO RELATED APPLICATION(S)

This application is a U.S. National Stage Filing under 35 U.S.C. § 371 from International Application No. PCT/CN2021/087481, filed on Apr. 15, 2021, and published as WO2022/048159 on Mar. 10, 2022, which claims priority to Chinese patent Application No. 202010932030.1 entitled "SEMICONDUCTOR DEVICE HAVING FERROELEC-TRIC OR NEGATIVE CAPACITOR AND METHOD OF MANUFACTURING THE SAME, AND ELECTRONIC DEVICE" filed on Sep. 7, 2020; the benefit of priority of each of which is hereby claimed herein, and which applications and publication are hereby incorporated herein by reference in their entireties.

TECHNICAL FIELD

The present disclosure relates to a field of semiconductors, and in particular to a semiconductor device having a ferroelectric or negative capacitor, a method of manufacturing the semiconductor device, and an electronic device including the semiconductor device.

BACKGROUND

With the increasing density of devices in integrated circuit (IC), the spacing between components is becoming smaller and smaller., which increases a proportion of an overlap capacitance between the components, such as between a gate electrode and a source/drain electrode, in the IC in a total capacitance of the device, and thus degrades an alternating current (AC) performance of the IC. Moreover, even for a device with low performance requirements, a low power consumption is desired, and thus a capacitance reduction is desired.

SUMMARY

In view of this, an object of the present disclosure is, at least in part, to provide a semiconductor device having a ferroelectric or negative capacitor, a method of manufacturing the same, and an electronic device including the semiconductor device.

According to an aspect of the present disclosure, a semiconductor device is provided, including: a gate electrode and a source/drain electrode formed on a substrate; a positive capacitor formed on the substrate, a first terminal of the positive capacitor being electrically connected to the gate electrode; a ferroelectric or negative capacitor formed on the substrate, a first terminal of the ferroelectric or negative capacitor being electrically connected to the gate electrode, wherein a second terminal of one of the positive capacitor and the ferroelectric or negative capacitor is electrically connected to a gate voltage application terminal, and a second terminal of the other of the positive capacitor and the ferroelectric or negative capacitor is electrically connected to the source/drain electrode.

According to another aspect of the present disclosure, a method of manufacturing a semiconductor device is provided, including: arranging a gate electrode and a source/ drain electrode of the semiconductor device on a substrate; forming a positive capacitor on the substrate, and electrically connecting a first terminal of the positive capacitor to the gate electrode; forming a ferroelectric or negative capacitor on the substrate, and electrically connecting a first terminal of the ferroelectric or negative capacitor to the gate electrode; and electrically connecting a second terminal of one of the positive capacitor and the ferroelectric or negative capacitor to a gate voltage application terminal, and electrically connecting a second terminal of the other of the positive capacitor and the ferroelectric or negative capacitor to the source/drain electrode.

According to another aspect of the present disclosure, an electronic device is provided, including the above-mentioned semiconductor device.

BRIEF DESCRIPTION OF THE DRAWINGS

The above and other objects, features and advantages of the present disclosure will be more apparent through the following description of embodiments of the present disclosure with reference to the accompanying drawings, in which FIG. 1(a) and FIG. 1(b) respectively schematically show equivalent circuit diagrams of semiconductor devices according to the embodiments of the present disclosure.

DETAILED DESCRIPTION OF EMBODIMENTS

Figure 1A:
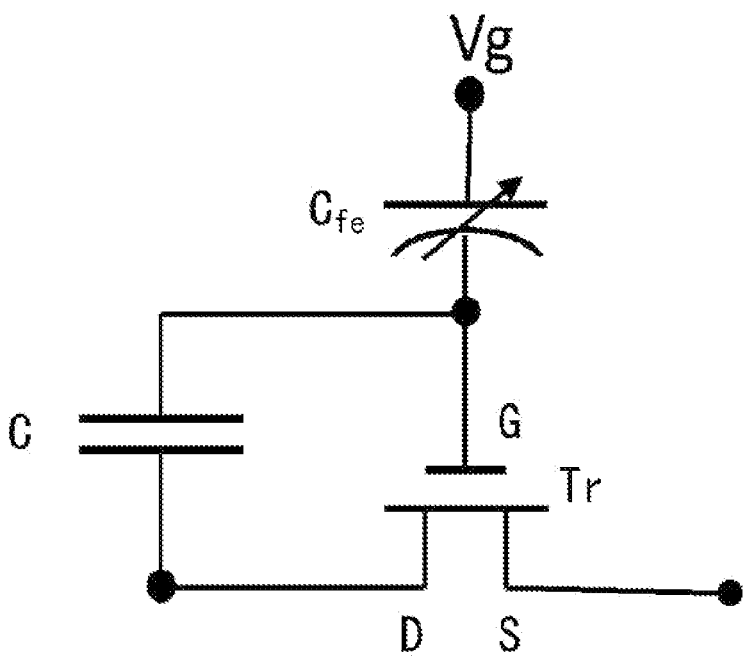

Embodiments of the present disclosure will be described with reference to the accompanying drawings. It should be understood, however, that these descriptions are merely exemplary and are not intended to limit the scope of the present disclosure. In addition, in the following description, descriptions of well-known structures and technologies are omitted to avoid unnecessarily obscuring the concepts of the present disclosure.

Various schematic structural diagrams according to the embodiments of the present disclosure are shown in the accompanying drawings. The figures are not drawn to scale. Some details are enlarged and some details may be omitted for clarity of presentation. Shapes of the various regions, layers and the relative size and positional relationship thereof shown in the drawings are only exemplary. In practice, there may be deviations due to manufacturing tolerances or technical limitations, and those skilled in the art may additional design regions/layers with different shapes, sizes, and relative positions according to actual needs.

In the context of the present disclosure, when a layer/element is referred to as being located "on" another layer/element, the layer/element may be directly on the another layer/element, or there may be an intermediate layer/element therebetween. In addition, if a layer/element is located "on" another layer/element in one orientation, the layer/element may be located "under" the another layer/element when the orientation is reversed.

The present disclosure may be presented in various forms, some examples of which will be described below. In the following description, a selection of various materials is involved. In the selection of materials, in addition to a function of the material (for example, a semiconductor material may be used to form an active region, a dielectric material may be used to form an electrical isolation), an etching selectivity is also considered. In the following description, a required etching selectivity may or may not be indicated. It should be clear to those skilled in the art that when etching a material layer is mentioned below, if it is not mentioned or shown that other layers are also etched, then the etching may be selective, and the material layer may have an etching selectivity relative to other layers exposed to the same etching formular.

Figure 1B:
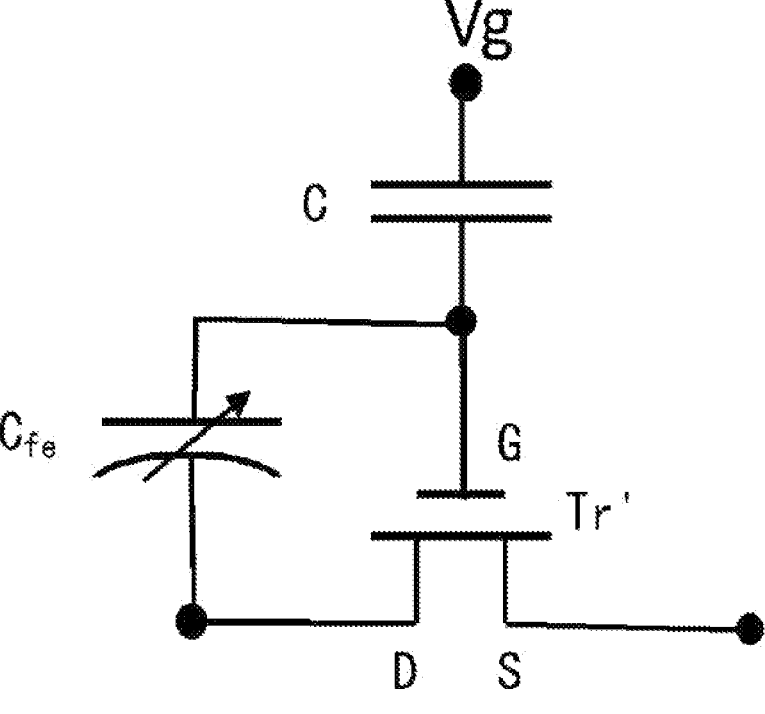

FIG. 1(a) and FIG. 1(b) respectively schematically show equivalent circuit diagrams of semiconductor devices according to the embodiments of the present disclosure.

As shown in FIG. 1(a), a semiconductor device Tr according to an embodiment may be various suitable semiconductor devices, such as a metal oxide semiconductor field effect transistor (MOSFET). The MOSFET may be formed in various forms, such as a planar MOSFET, a fin field effect transistor (FinFET), a nanowire FET, or a nanosheet FET. The semiconductor device Tr may include a gate electrode G, a source electrode S, and a drain electrode D. Generally, the source electrode S and the drain electrode D of the MOSFET have the same configuration and may be interchanged, and thus they may also be collectively referred to as "source/drain electrode". In the present disclosure, the "source/drain electrode" may refer to one or both of the source electrode S and the drain electrode D, and those skilled in the art may clarify the meaning of the "source/drain electrode" according to the context.

In addition, the semiconductor device Tr may further include two capacitors C and $C_{fe}$. The capacitor C may be an existing capacitor, i.e., having an existing dielectric material as its capacitance dielectric. One terminal (hereinafter referred to as "first terminal") of the capacitor C may be electrically connected to the gate electrode G, and the other terminal (hereinafter referred to as "second terminal") may be electrically connected to one of the source electrode and the drain electrode, such as the drain electrode D. In addition, the capacitor $C_{fe}$ may have a ferroelectric material or a negative capacitance material as its capacitance dielectric (and thus may be referred to as a "ferroelectric or negative capacitor"). One terminal (hereinafter referred to as "first terminal") of the capacitor $C_{fe}$ may be electrically connected to the gate electrode G, and the other terminal (hereinafter referred to as "second terminal") may be electrically connected to a gate voltage application terminal to apply a gate voltage Vg. More specifically, the gate voltage Vg is applied to the gate electrode G via the ferroelectric or negative capacitor $C_{fe}$.

The ferroelectric material is generally in one of two polarization states, such as one of upward polarization or downward polarization. However, under some special conditions (special matching of capacitance), the ferroelectric material may be stabilized between the two polarization states, that is, the so-called negative capacitance state, and may thus be called a negative capacitance material. Therefore, the ferroelectric material is referred to herein as "ferroelectric or negative capacitance material". For example, the ferroelectric or negative capacitance material includes an oxide containing Hf, Zr and/or Si such as HfZrO.

Depending on a state of the ferroelectric or negative capacitance material, the device may exhibit different performances such as threshold voltage (Vt), drain-induced barrier lowering (DIBL), subthreshold swing (SS), etc. For example, when ferroelectric materials are mutually converted in different polarization states, data may be stored according to different device states such as Vt caused by different polarization states, therefore the semiconductor device Tr may be used in a memory device. In addition, when the ferroelectric material is stabilized between two polarization states (in a negative capacitance state), a resulting negative capacitance value may reduce an overlap capacitance in the device, so that the device performance may be improved. The semiconductor device Tr may thus be used in a logic device. In particular, when the ferroelectric or negative capacitor $C_{fe}$ has a negative value, an absolute value of the value of the ferroelectric or negative capacitor $C_{fe}$ may be greater than a sum of a capacitance value of the capacitor C, a capacitance value between the gate electrode G and the source electrode S, and a capacitance value between the gate electrode G and the drain electrode D, which may even result in an SS of less than 60 mV/dec at a temperature of 300K.

Therefore, the semiconductor device according to the present disclosure may be used for both the memory device and the logic device.

FIG. 1(b) shows a semiconductor device Tr' according to another embodiment of the present disclosure. The device Tr' shown in FIG. 1(b) is substantially the same as the device Tr shown in FIG. 1(a), except that the positions of the capacitor C and the ferroelectric or negative capacitor $C_{fe}$ are interchanged.

In the examples of FIGS. 1(a) and 1(b), although it is shown that a capacitor is connected at the drain electrode, the present disclosure is not limited thereto. For example, the capacitor may also be connected at the source electrode, or may be connected at both the source and drain electrodes.

FIG. 2 to FIG. 11 schematically show some stages in a process of manufacturing a semiconductor device according to an embodiment of the present disclosure.

Figure 2:
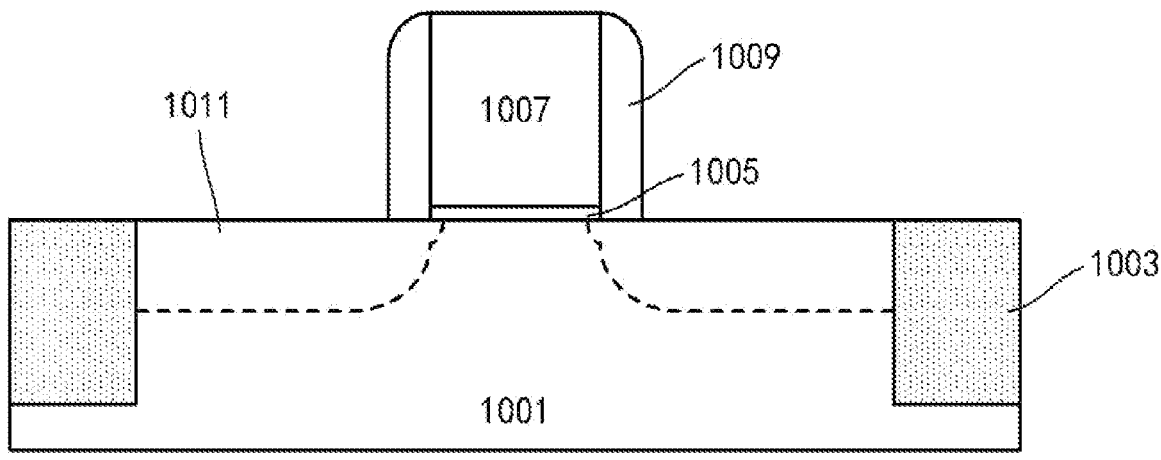
FIG. 2 to FIG. 11 schematically show some stages in a process of manufacturing a semiconductor device according to an embodiment of the present disclosure.

As shown in FIG. 2, a substrate 1001 is provided. The substrate 1001 may be a substrate of various forms including, but not limited to, a bulk semiconductor material substrate such as a bulk Si substrate, a semiconductor-on-insulator (SOI) substrate, a compound semiconductor substrate such as a SiGe substrate, and the like. In the following description, for the convenience of description, the bulk Si substrate is described as an example. Here, a silicon wafer is provided as the substrate 1001.

An isolation portion 1003, such as a Shallow Trench Isolation (STI) of an oxide, may be formed on the substrate 1001 to define an active region. In addition, a gate stack including a gate dielectric layer 1005 and a gate conductor layer 1007, a spacer 1009 formed on a sidewall of the gate stack, and source/drain regions 1011 formed in the active region on opposite sides of the gate stack are formed on the substrate 1001. The gate stack may intersect the active region so as to define a channel region. There are multiple manners in the art to form the device structure, which will not be repeated here. In addition, although the case of a planar MOSFET is shown in FIG. 2, the present disclosure is not limited thereto. As described above, the present disclosure is applicable to other types of MOSFETs, such as FinFETs, horizontal or vertical nanowire FETs, or horizontal or vertical nanosheet FETs.

Figure 3:
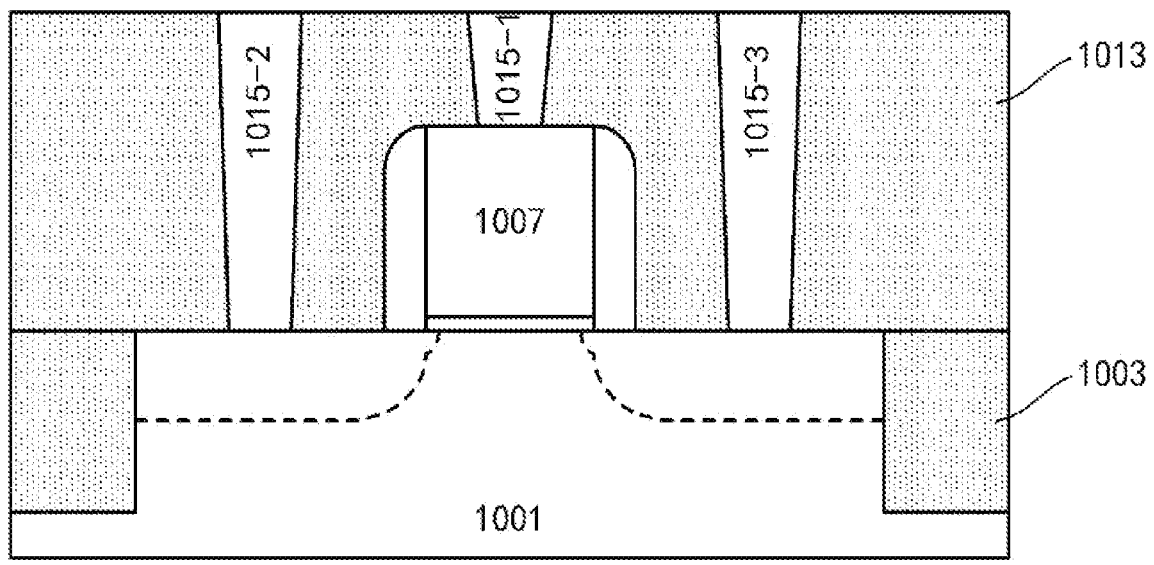

The gate electrode may be led out from the gate conductor layer 1007, and the source/drain electrodes may be led out from the source/drain regions 1011. For example, as shown in FIG. 3, a first interlayer dielectric layer 1013 may be formed on the substrate 1001, and contact portions 1015-1, 1015-2 and 1015-3 to the gate conductor layer 1007 and the source/drain regions 1011, respectively, may be formed in the first interlayer dielectric layer 1013. For example, the first interlayer dielectric layer 1013 may include an oxide, and the contact portions 1015-1, 1015-2, and 1015-3 may include a conductive material such as a metal, such as W.

As described above, for the gate electrode and the source/drain electrode, a capacitor may be provided. In order to save area, the capacitor may be arranged to at least partially overlap the gate stack and the source/drain region in a vertical direction, and preferably overlap the contact portions to the gate stack and the source/drain regions. There are multiple manners in the art to form the capacitor. Only some examples will be described below.

Figures 4, 5:
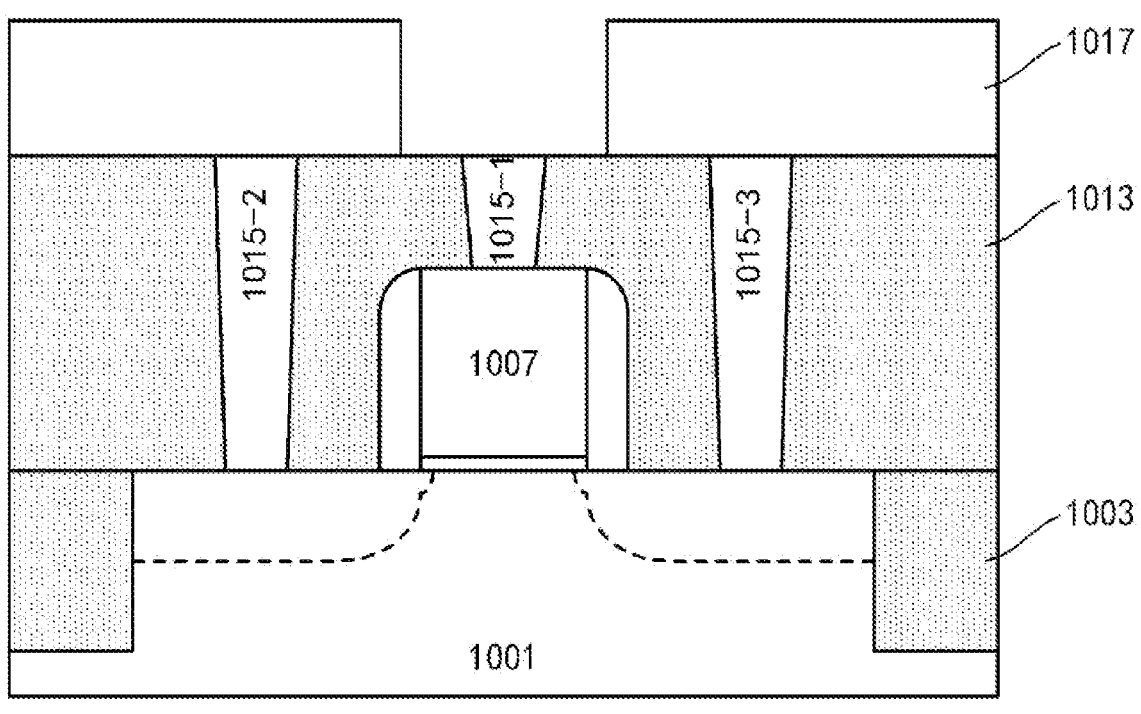

For example, as shown in FIG. 4, a mold layer 1017 may be formed on the first interlayer dielectric layer 1013 by, for example, deposition. For example, the mold layer 1017 may include SiC with a thickness in a range of about 20 nm to 150 nm. The mold layer 1017 may be used to define a location and a height of a capacitor to be formed. A height of the mold layer 1017 may be adjusted to adjust a capacitance value of the capacitor subsequently formed. In the mold layer 1017, an opening may be formed by, for example, photolithography to expose the contact portion 1015-1. Due to a presence of the opening, a trench-type capacitor may be formed, and the capacitor may be in contact with and thus electrically connected to the contact portion 1015-1 (i.e., electrically connected to the gate conductor layer 1007).

As shown in FIG. 5, a first conductive layer 1019 and a ferroelectric or negative capacitance material layer 1021 may be sequentially formed by, for example, deposition. For good control of deposition thickness and quality, an atomic layer deposition (ALD) may be used. For example, the first conductive layer 1019 may include various suitable conductive materials, such as metals such as W, Co, Ru, or conductive metal nitrides such as TiN. The first conductive layer 1019 is not limited to a single layer, but may include a multi-layer, so as to optimize a resistance and/or properties of the resulting capacitor. The ferroelectric or negative capacitance material layer 1021 may include HfZrO with a thickness in a range of about 1 nm to 20 nm. A material of the ferroelectric or negative capacitance material layer 1021 may be selected or a thickness thereof may be adjusted to achieve an adjustment of a capacitance value of the resulting capacitor. The first conductive layer 1019 and the ferroelectric or negative capacitance material layer 1021 may be formed substantially conformally, and thus may extend along a sidewall and a bottom surface of the opening. In the opening with the first conductive layer 1019 and the ferroelectric or negative capacitance material layer 1021 formed, a second conductive layer 1023 may be further formed by deposition. Similar to the first conductive layer 1019, the second conductive layer 1023 may include various suitable conductive materials, and may include a single layer or multi-layer. The second conductive layer 1023 may fill the opening and then be etched back, thereby freeing up some space (which may then be filled with a dielectric material so as to better isolate the resulting capacitor from another capacitor subsequently formed) at an upper part of the opening. For better control of an etching depth, an atomic layer etching (ALE) may be used to better control a capacitance value.

Figure 6:
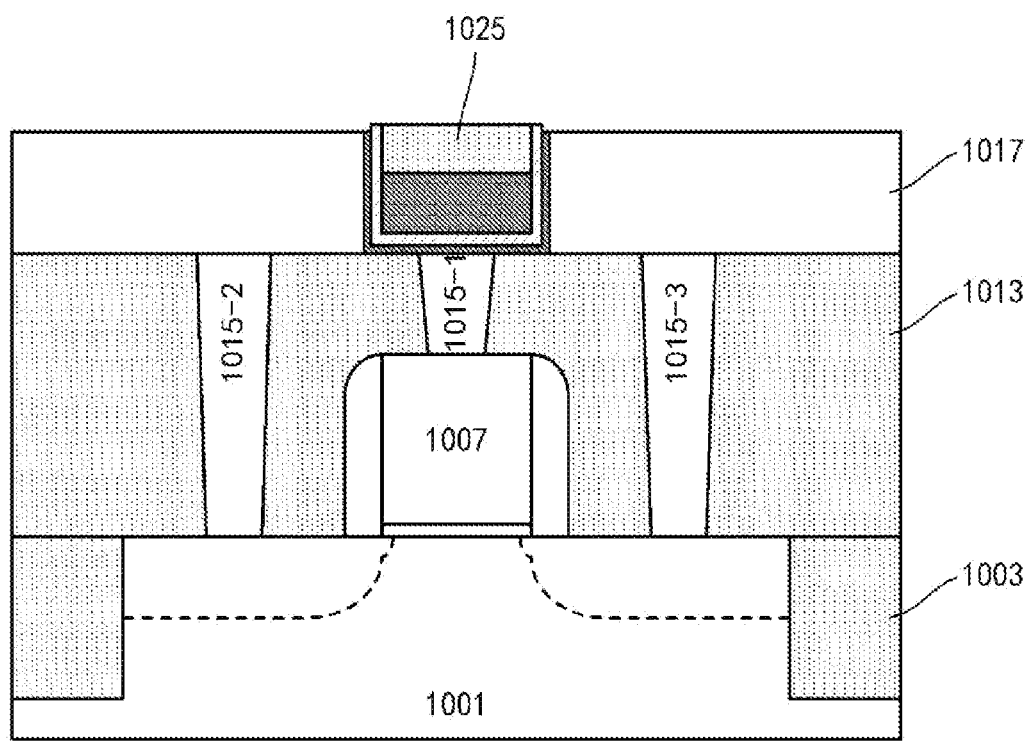

As shown in FIG. 6, a dielectric material 1025, such as an oxide, may be filled in the freed space at the upper part of the opening. For example, the oxide may be deposited, and the deposited oxide may be subjected to a planarization process such as chemical mechanical polishing (CMP), which may be stopped at the first conductive layer 1019. In addition, the first conductive layer 1019 may be etched back to remove a portion outside the opening. Thus, a trench-type capacitor may be formed in the opening, and the capacitor may use the first conductive layer 1019 and the second conductive layer 1023 as a first electrode plate and a second electrode plate of the capacitor, with the ferroelectric or negative capacitance layer 1021 sandwiched between the first electrode plate and the second electrode plate. The first conductive layer 1019, i.e., the first electrode plate, is in contact with the contact portion 1015-1, so as to be electrically connected to the gate conductor layer 1007.

As described above, a capacitor may be formed for one or both of the source/drain regions. Here, a capacitor formed for a source/drain region on the left side of the figures as an example is described. In addition, considering that the formed two capacitors are electrically connected to the gate electrode in common (see FIG. 1(*a*) and FIG. 1(*b*)), and the first conductive layer 1019 has been electrically connected to the gate electrode, (a portion of) the first conductive layer 1019 may be used as an electrode plate of a capacitor to be formed next.

Figure 7:
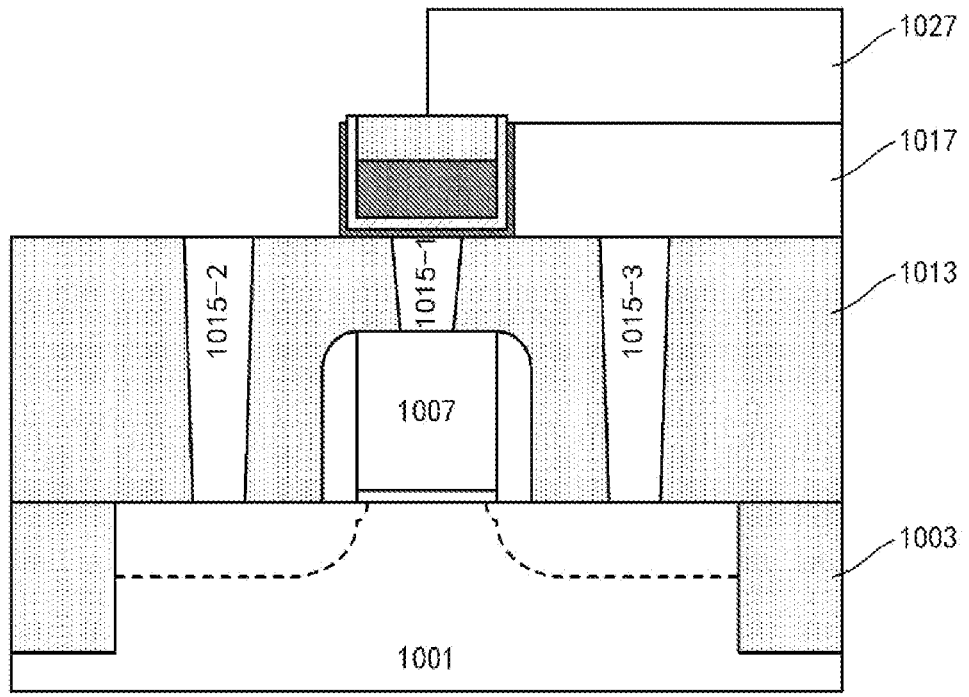

As shown in FIG. 7, a photoresist 1027 may be formed on the mold layer 1017 and patterned by photolithography to shield a region on the right side of the gate stack. In order to ensure process margin, the photoresist 1027 may also mask a right portion of the gate stack. The mold layer 1017 is selectively etched by, for example, a reactive ion etching (RIE) with the photoresist 1027 thus patterned as a mask. In this way, a region on the left side of the gate stack may be exposed, especially the contact portion 1015-2 to the source/drain region on the left, and a portion of the first conductive layer 1019 on a left sidewall of the gate stack may be exposed. After that, the photoresist 1027 may be removed.

Figure 8:
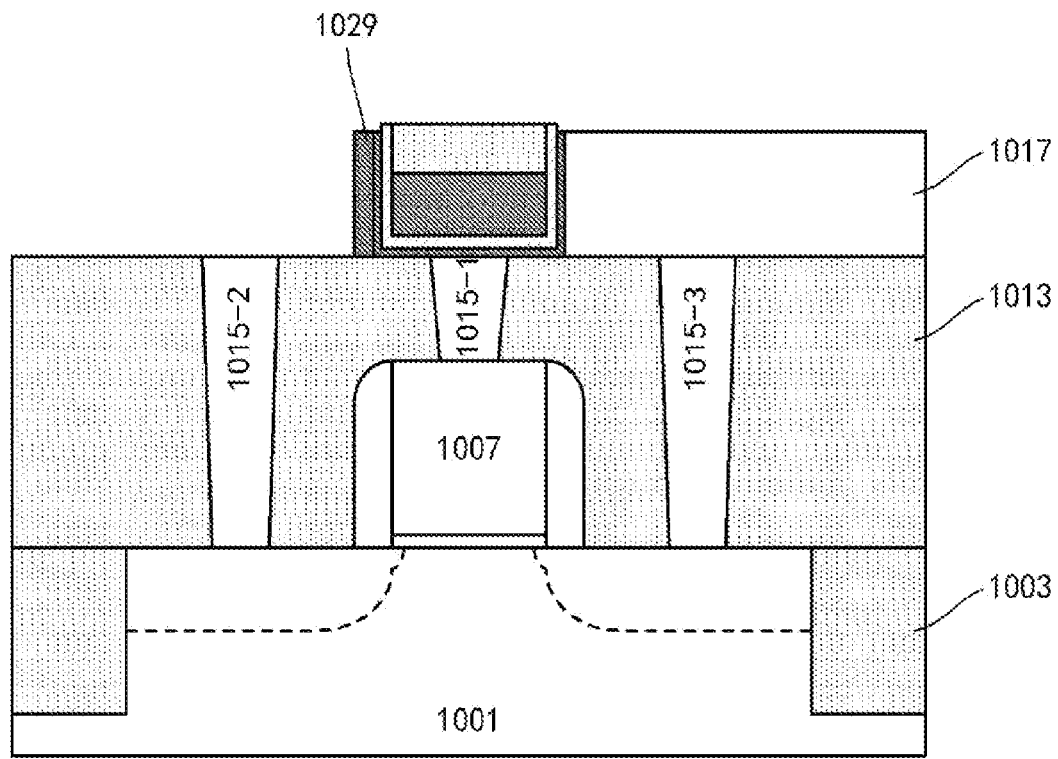

In addition, as shown in FIG. 8, in order to reduce a resistance between two capacitors, an exposed portion of the first conductive layer 1019 may be thickened. For example, a conductive layer 1029 in a form of a spacer may be formed on the sidewall of the first conductive layer 1019 through a spacer forming process. For example, the conductive layer 1029 may include various suitable conductive materials, which may be the same as or different from the conductive material of the first conductive layer 1019, with a thickness in a range of, for example, about 2 nm to 10 nm.

After that, a vertical capacitor may be formed based on the first conductive layer 1019 and the conductive layer 1029.

Figure 9:
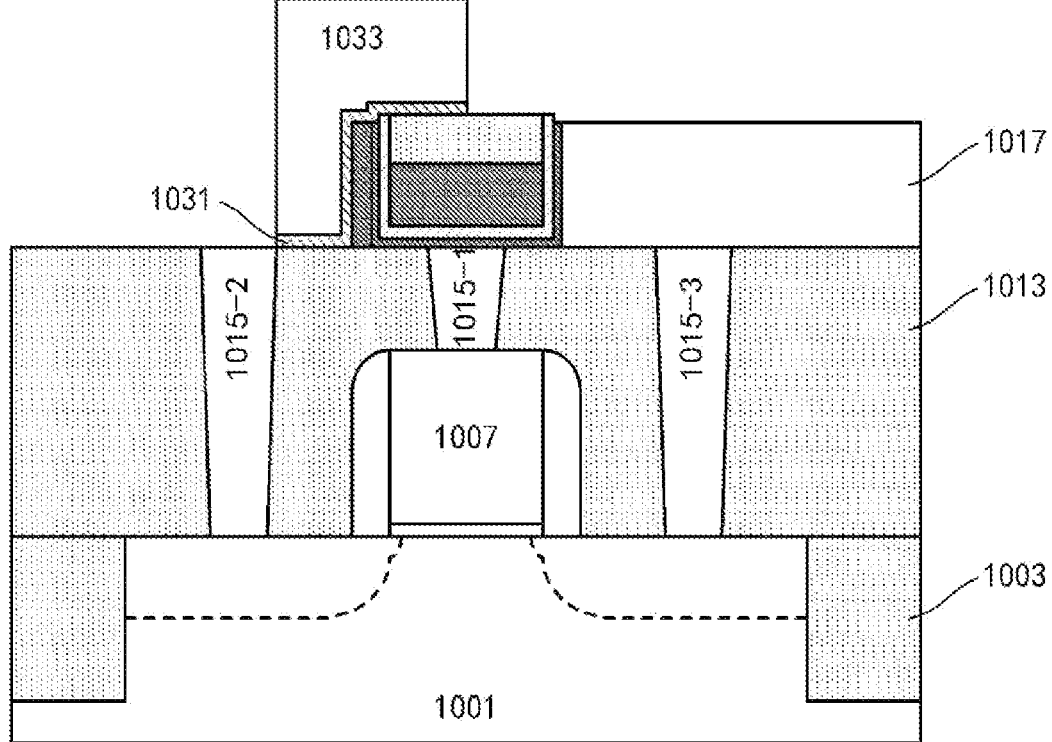

For example, as shown in FIG. 9, a dielectric layer 1031 may be formed by, for example, deposition. Since the ferroelectric or negative capacitor is previously formed, a positive capacitor may be formed here. That is, the dielectric layer 1031 may include an existing dielectric material. In the present disclosure, "dielectric material" refers to an existing dielectric material that exhibits positive capacitance properties. For example, the dielectric layer 1031 may include a high-k dielectric material such as HfO with a thickness in a range of about 2 nm to 10 nm.

The dielectric layer 1031 may be patterned through a photoresist 1033. On the one hand, the dielectric layer 1031 may expose the contact portion 1015-2 so as not to affect an electrical connection between a subsequently formed third conductive layer and the contact portion 1015-2. On the other hand, the dielectric layer 1031 may completely cover the first conductive layer 1019 and the conductive layer 1029, especially the top thereof, to reliably isolate them from the subsequently formed third conductive layer. The dielectric layer 1031 should not be too large so as not to introduce an excessive parasitic capacitance into the device. After that, the photoresist 1033 may be removed.

Figure 10:
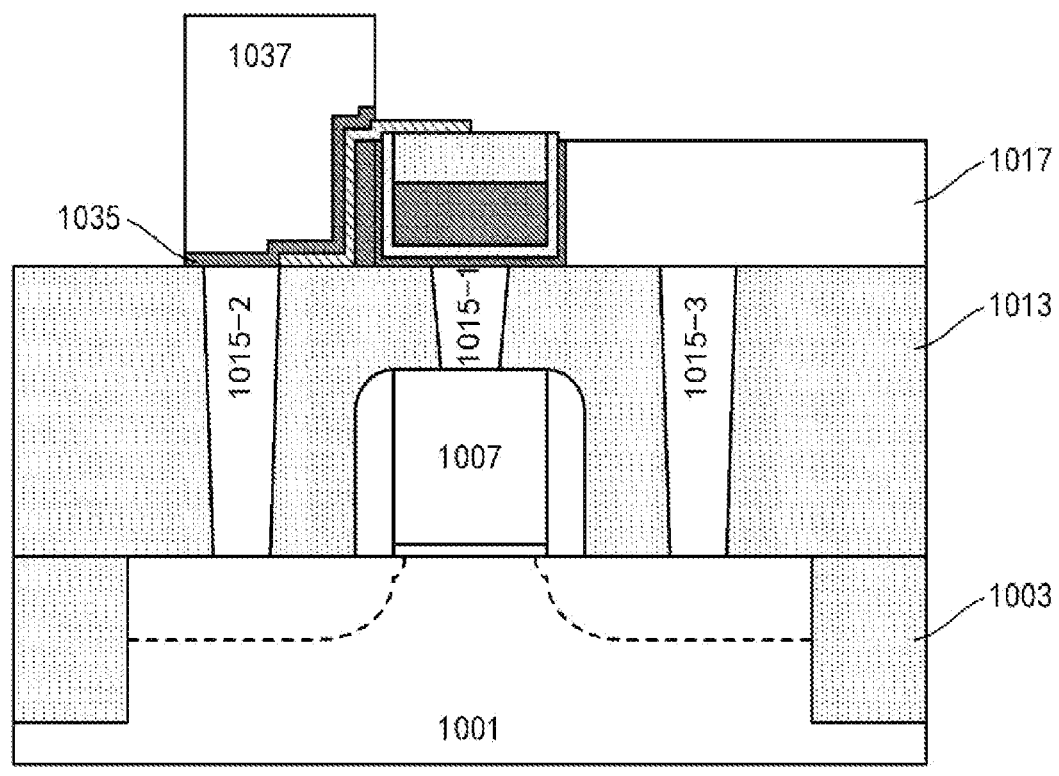

Then, as shown in FIG. 10, a third conductive layer 1035 may be formed on the dielectric layer 1031. Similarly, the third conductive layer 1035 may include various suitable conductive materials, and may include a single layer or multi-layer. The third conductive layer 1035 may be patterned through a photoresist 1037. The third conductive layer 1035 may be in contact with and thus be electrically connected to the contact portion 1015-2. After that, the photoresist 1037 may be removed. Thus, a vertical capacitor is formed, which uses the first conductive layer 1019 and the conductive layer 1029 as an electrode plate and the third conductive layer 1035 as the other electrode plate, with the dielectric layer 1031 sandwiched between the two electrode plates.

Figure 11:
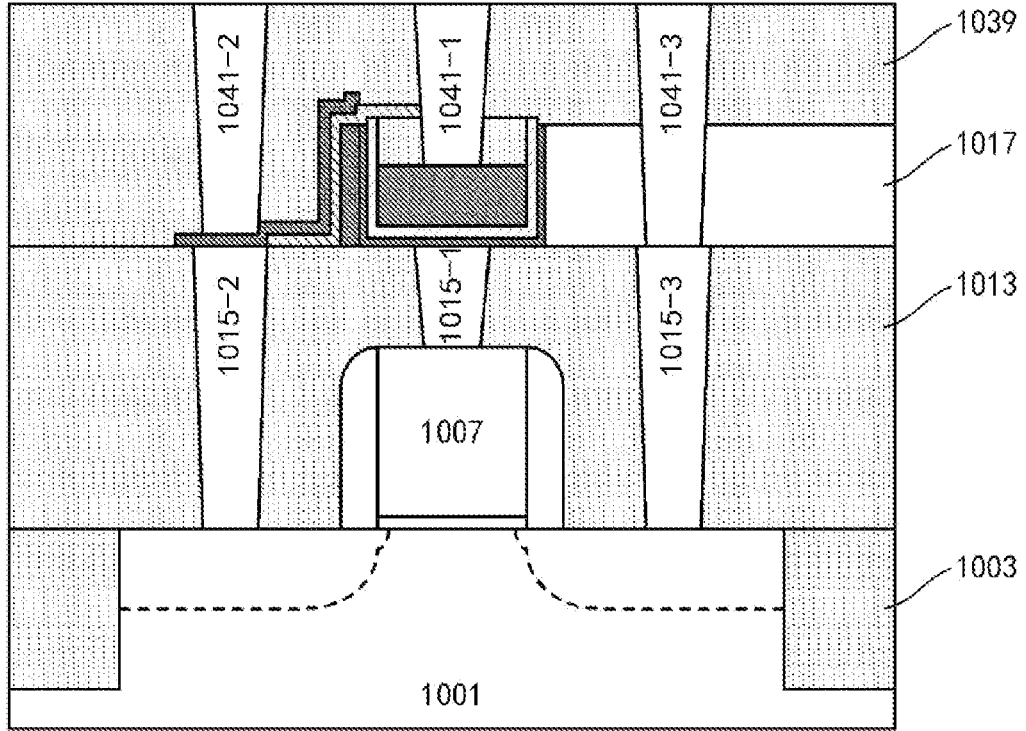

In this way, the manufacturing of the semiconductor device according to the embodiment is substantially completed. Subsequently, an interconnection structure may be fabricated to achieve an electrical connection. For example, as shown in FIG. 11, a second interlayer dielectric layer 1039 may be formed on the first interlayer dielectric layer 1013 (and the mold layer 1017), and a contact portion 1041-1 to the second conductive layer 1023, a contact portion 1041-2 to the third conductive layer 1035, and a contact portion 1041-3 to the contact portion 1015-3 (and thus electrically connected to the source/drain region on the right) may be formed in the second interlayer dielectric layer 1039. Regarding the interlayer dielectric layers and the contact portions, please refer to the above description.

A device shown in FIG. 11 may have an equivalent circuit as shown in FIG. 1(*a*).

Figure 12:
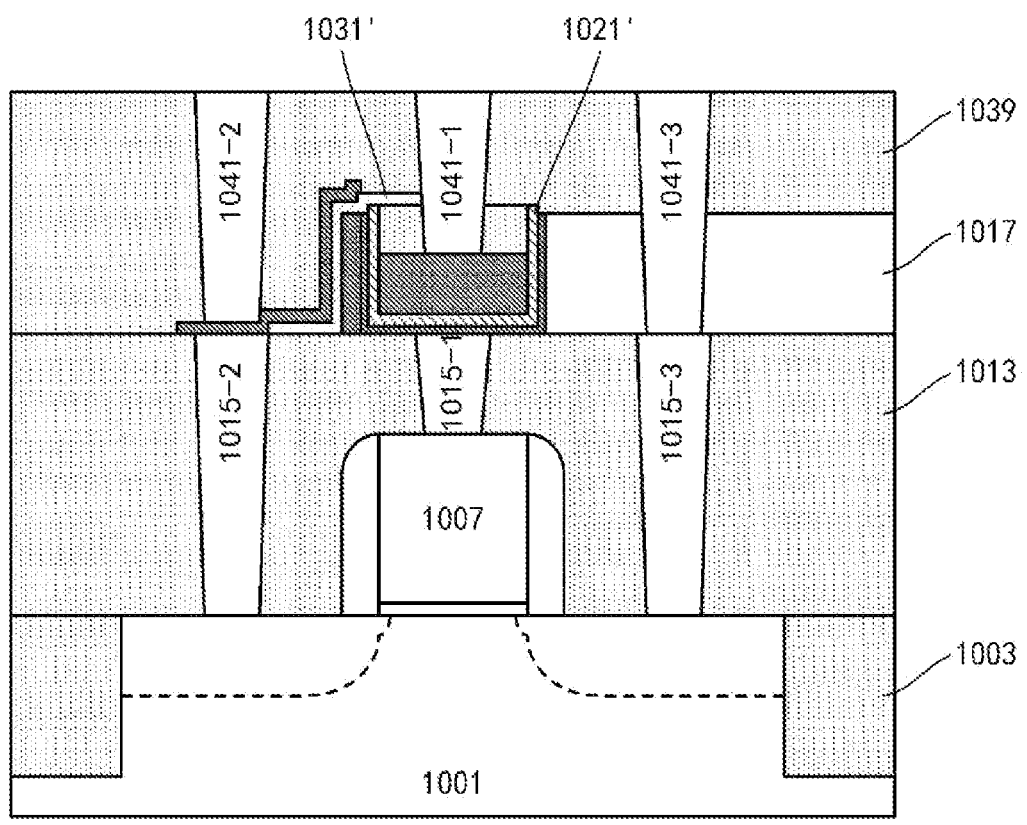
FIG. 12 schematically shows a semiconductor device according to another embodiment.

FIG. 12 schematically shows a semiconductor device according to another embodiment. A device shown in FIG. 12 is substantially the same as the device shown in FIG. 11, except that a dielectric layer 1021' includes an (existing) dielectric material and a dielectric layer 1031' includes a ferroelectric or negative capacitance material. The device shown in FIG. 12 may have an equivalent circuit as shown in FIG. 1(*b*).

In the above-mentioned embodiments, a capacitor may be formed only for the source/drain region on one side, but the present disclosure is not limited thereto. For example, capacitors may be formed for source/drain regions on both sides. A capacitor on the other side may also be formed separately as described above. For example, a region on the left side of the gate stack (the capacitor has been formed as described above) may be shielded and a region on the right side of the gate stack may be exposed by removing the mold layer 1017. The capacitor may be formed on the exposed region, for example, according to the above-mentioned process.

In order to simplify a process, the capacitors on both sides may be formed together through the same process step.

Figure 13:
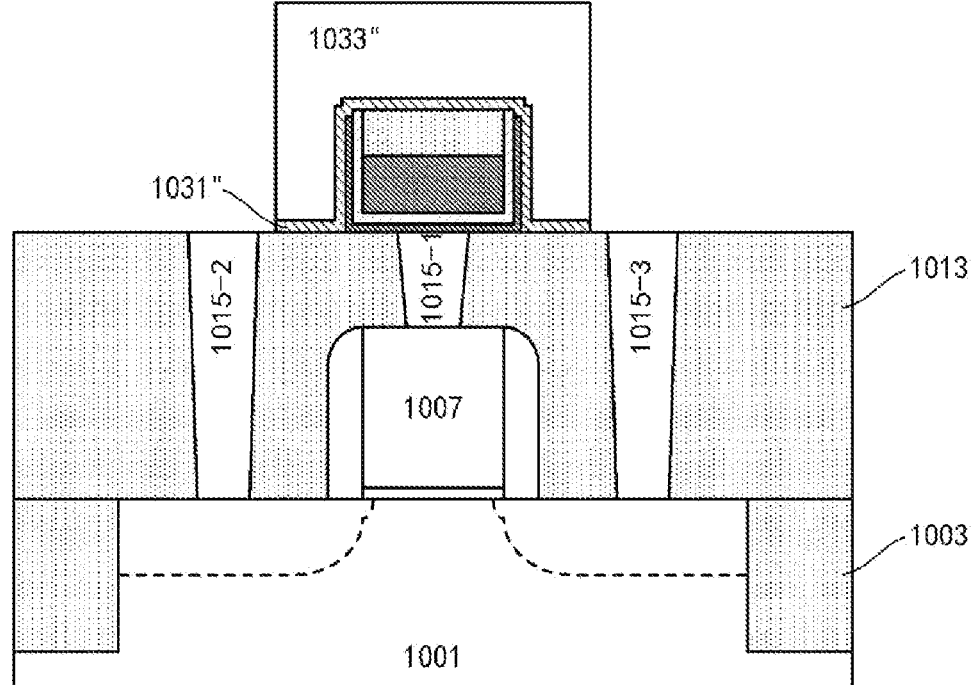
FIG. 13 to FIG. 15 schematically show some stages in a process of manufacturing a semiconductor device according to an embodiment of the present disclosure.

For example, as shown in FIG. 13, the mold layer 1017 may be removed after a trench-type capacitor is formed as described above in conjunction with FIG. 7, and a dielectric layer 1031" may be formed by, for example, deposition. For this, please see the above description in conjunction with FIG. 9.

Similarly, the dielectric layer 1031" may be patterned through a photoresist 1033". Here, the patterned dielectric layer 1031" may extend from one side of the gate stack to the other side of the gate stack, and the contact portions 1015-2 and 1015-3 are exposed on both sides of the gate stack, respectively. It should be noted that extension ranges of the dielectric layer 1031" on both sides of the gate stack may be different. After that, the photoresist 1033" may be removed.

Figure 14:
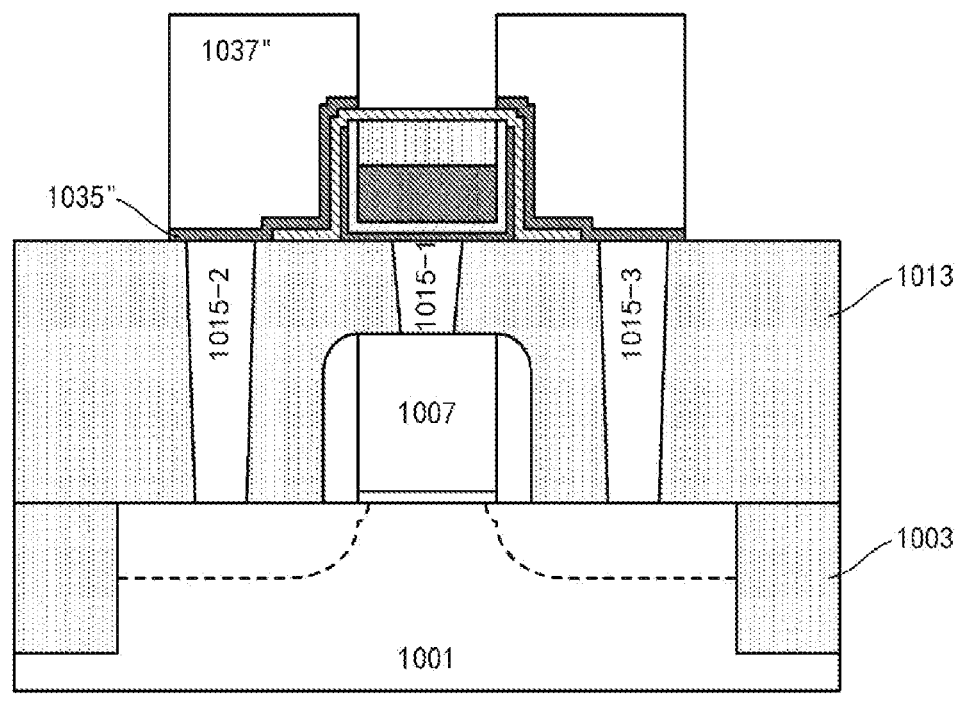

Then, as shown in FIG. 14, a third conductive layer 1035" may be formed on the dielectric layer 1031". Similarly, the third conductive layer 1035" may include various suitable conductive materials, and may include a single layer or multi-layer. The third conductive layer 1035" may be patterned through a photoresist 1037". Here, the third conductive layer 1035" may be patterned into two portions on opposite sides of the gate stack, and thus capacitors are formed on opposite sides of the gate stack, respectively. On the left side of the gate stack, the third conductive layer 1035" may be in contact with and thus be electrically connected to the contact portion 1015-2; on the right side of the gate stack, the third conductive layer 1035" may be in contact with and thus be electrically connected to the contact portion 1015-3. After that, the photoresist 1037" may be removed.

Figure 15:
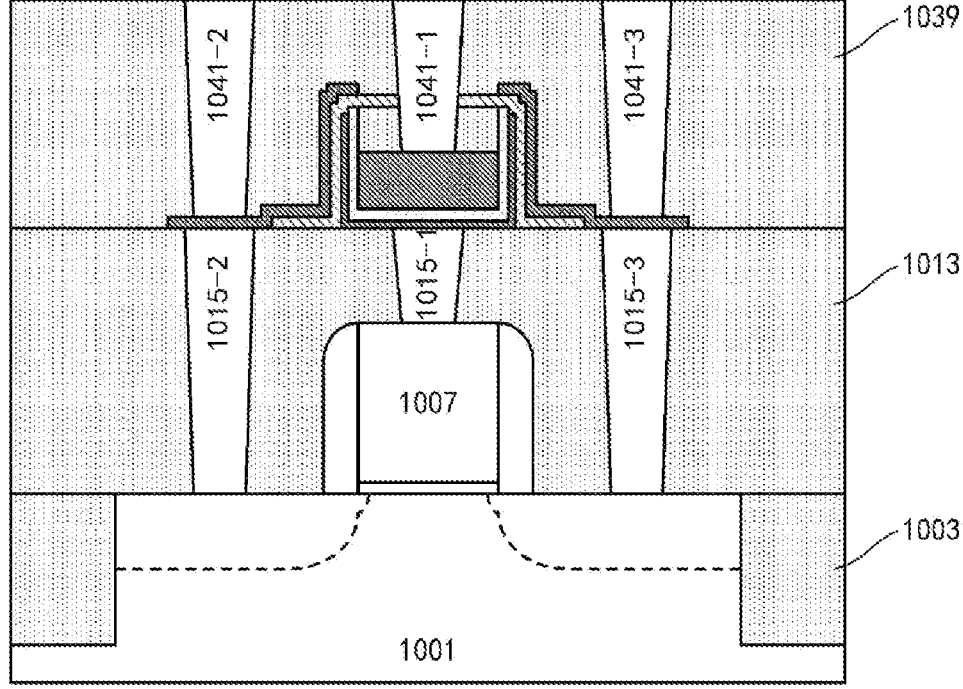

As shown in FIG. 15, an interconnection structure may be fabricated to achieve an electrical connection. For this, please refer to the above description in conjunction with FIG. 11. The device shown in FIG. 15 may have an equivalent circuit as shown in FIG. 1(*a*), and additionally a positive capacitor is connected between the gate electrode G and the source electrode S.

Figure 16:
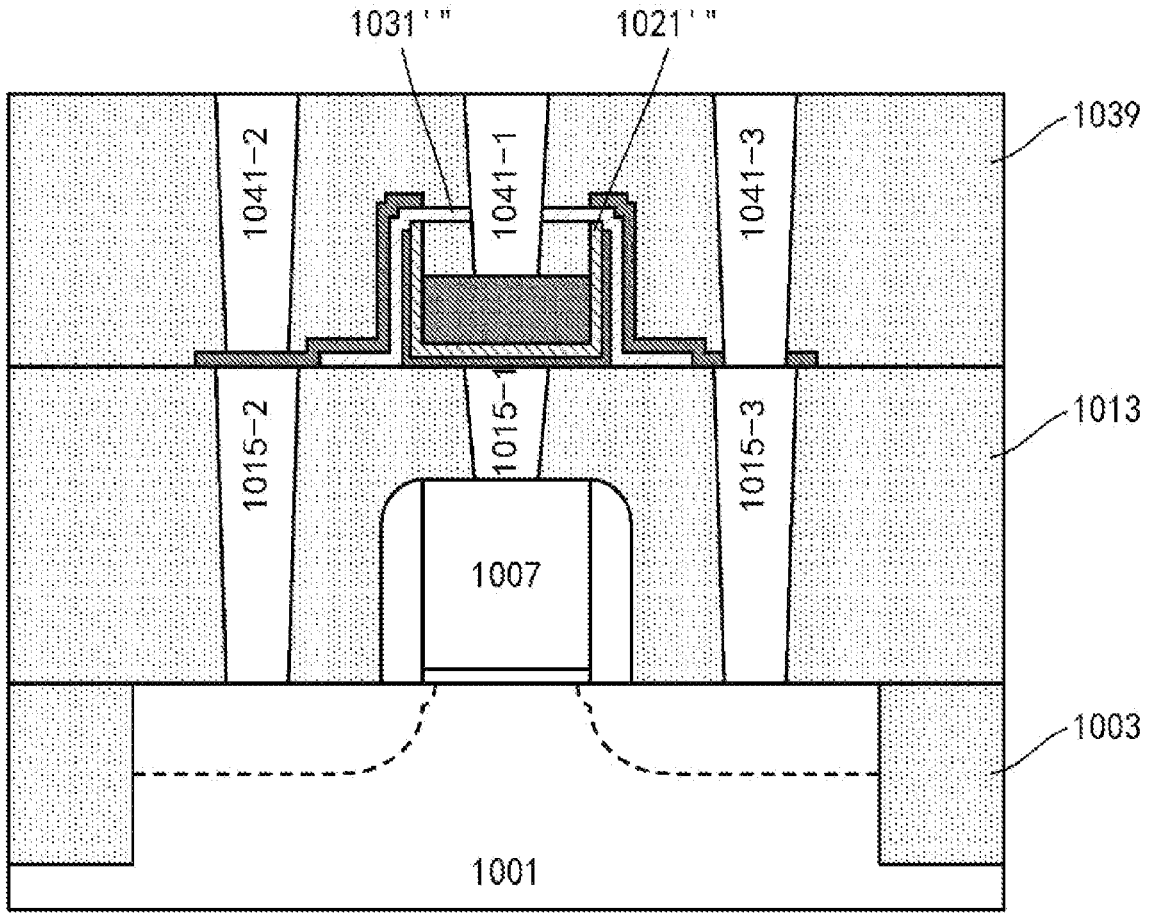
FIG. 16 schematically shows a semiconductor device according to another embodiment.

Similarly, positions of the positive capacitor and the ferroelectric/negative capacitor may be exchanged. For example, a device shown in FIG. 16 is substantially the same as the device shown in FIG. 15, except that a dielectric layer 1021''' includes an (existing) dielectric material and a dielectric layer 1031''' includes a ferroelectric or negative capacitance material. The device shown in FIG. 16 may have an equivalent circuit as shown in FIG. 1(*b*) and additionally a ferroelectric/negative capacitor is connected between the gate electrode G and the source electrode S.

According to embodiments of the present disclosure, both a positive capacitor and a ferroelectric or negative capacitor are introduced in the semiconductor device such as a metal oxide semiconductor field effect transistor (MOSFET). Characteristics of the device such as threshold voltage (Vt), drain-induced barrier lowering (DIBL), subthreshold swing (SS), etc. may be tuned through the ferroelectric or negative capacitor.

The semiconductor device according to the embodiments of the present disclosure may be applied to various electronic devices. For example, an integrated circuit (IC) may be formed based on the semiconductor device, and thus an electronic device may be constructed. Therefore, the present disclosure further provides an electronic device including the above-mentioned semiconductor device. The electronic device may also include components such as a display screen cooperating with the integrated circuit and a wireless transceiver cooperating with the integrated circuit. The electronic device may include, for example, a smart phone, a computer, a tablet computer, a wearable smart device, an artificial intelligence device, a mobile power supply and the like.

According to the embodiments of the present disclosure, there is further provided a method of manufacturing a system on a chip (SoC). The method may include the above-mentioned methods. Specifically, a variety of devices may be integrated on a chip, at least some of which are manufactured according to the methods of the present disclosure.

In the above description, the technical details such as patterning and etching of each layer have not been described in detail. However, those skilled in the art may understand that various technical means may be used to form layers, regions, etc. of desired shapes. In addition, in order to form the same structure, those skilled in the art may further design a method that is not exactly the same as the methods described above. In addition, although the various embodiments are described above separately, this does not mean that the measures in the various embodiments may not be advantageously used in combination.

The embodiments of the present disclosure have been described above. However, these embodiments are for illustrative purposes only, and are not intended to limit the scope of the present disclosure. The scope of the present disclosure is defined by the appended claims and their equivalents. Without departing from the scope of the present disclosure, those skilled in the art may make various substitutions and modifications, and these substitutions and modifications should all fall within the scope of the present disclosure.

What is claimed is:

1. A semiconductor device, comprising:
a gate electrode and a source/drain electrode formed on a substrate;
a positive capacitor formed on the substrate, a first terminal of the positive capacitor being electrically connected to the gate electrode; and
a ferroelectric or negative capacitor formed on the substrate, a first terminal of the ferroelectric or negative capacitor being electrically connected to the gate electrode,
wherein a second terminal of one of the positive capacitor and the ferroelectric or negative capacitor is electrically connected to a gate voltage application terminal, and a second terminal of the other of the positive capacitor and the ferroelectric or negative capacitor is electrically connected to the source/drain electrode;
wherein the semiconductor device further comprises:
an active region formed on the substrate;
a gate stack formed on and intersecting the active region, the gate stack including a gate dielectric layer and a gate conductor layer, wherein the gate electrode is led out from the gate conductor layer; and
source/drain regions formed in the active region on opposite sides of the gate stack, wherein the source/drain electrode is led out from one of the source/drain regions,
one of the positive capacitor and the ferroelectric or negative capacitor comprises a U-shaped first dielectric layer, a first electrode plate extending along a sidewall and a bottom surface of the U-shaped first dielectric layer and a second electrode plate formed on an inner side of the U-shaped first dielectric layer, wherein the first electrode plate and the second electrode plate are opposite to each other with the first dielectric layer sandwiched therebetween, the first electrode plate is electrically connected to the gate conductor layer, and the second electrode plate is electrically connected to the gate voltage application terminal,
the other of the positive capacitor and the ferroelectric or negative capacitor comprises a second dielectric layer formed on a sidewall, close to one of the source/drain regions, of the first electrode plate and a third electrode plate formed on the second dielectric layer, wherein the first electrode plate and the third electrode plate are opposite to each other with the second dielectric layer sandwiched therebetween, and the third electrode plate is electrically connected to one of the source/drain regions.

2. The semiconductor device according to claim 1, wherein the semiconductor device comprises a metal oxide semiconductor field effect transistor MOSFET.

3. The semiconductor device according to claim 2, wherein an absolute value of a capacitance value of the ferroelectric or negative capacitor is greater than a sum of a capacitance value of the positive capacitor, a capacitance value between the gate electrode of the MOSFET and the source/drain electrode of the MOSFET, and a capacitance value between the gate electrode of the MOSFET and another source/drain electrode of the MOSFET.

4. The semiconductor device according to claim 3, wherein the MOSFET has a subthreshold swing of less than 60 mV/dec at a temperature of 300K.

5. The semiconductor device according to claim 1, wherein,
one of the positive capacitor and the ferroelectric or negative capacitor is disposed above the gate stack and at least partially overlaps the gate stack in a vertical direction, and
the other of the positive capacitor and the ferroelectric or negative capacitor is disposed above one of the source/drain regions and at least partially overlaps one of the source/drain regions in the vertical direction.

6. The semiconductor device according to claim 1, wherein a portion of the first electrode plate adjacent to the second dielectric layer is thickened relative to other portions of the first electrode plate.

7. The semiconductor device according to claim 1, further comprising:
a first interlayer dielectric layer formed on the substrate;
a first contact portion to the gate conductor layer and a second contact portion to one of the source/drain regions formed in the first interlayer dielectric layer;
a second interlayer dielectric layer on the first interlayer dielectric layer, wherein the positive capacitor and the ferroelectric or negative capacitor are formed in the second interlayer dielectric layer,
wherein one of the positive capacitor and the ferroelectric or negative capacitor overlaps the first contact portion in a vertical direction, and the first electrode plate is in contact with the first contact portion, and
the other of the positive capacitor and the ferroelectric or negative capacitor overlaps the second contact portion in the vertical direction, and the third electrode plate is in contact with the second contact portion.

8. The semiconductor device according to claim 1, wherein one of the first dielectric layer and the second dielectric layer comprises a dielectric material, and the other of the first dielectric layer and the second dielectric layer comprises a ferroelectric or negative capacitance material.

9. The semiconductor device according to claim 8, wherein the ferroelectric or negative capacitance material comprises an oxide containing Hf, Zr and/or Si.

10. The semiconductor device according to claim 1, further comprising:
another capacitor electrically connected to the other of the source/drain regions, the another capacitor comprising a third dielectric layer formed on a sidewall, close to the other of the source/drain regions, of the first electrode plate and a fourth electrode plate formed on the third dielectric layer, wherein the first electrode plate and the fourth electrode plate are opposite to each other with the third dielectric layer sandwiched therebetween, and the fourth electrode plate is electrically connected to the other of the source/drain regions.

11. The semiconductor device according to claim 10, wherein the third dielectric layer and the second dielectric layer comprise a same material and have substantially a same thickness.

12. The semiconductor device according to claim 11, wherein the fourth electrode plate and the third electrode plate comprise a same material and have substantially a same thickness.

13. An electronic device comprising the semiconductor device of claim 1.

14. The electronic device according to claim 13, comprising a smart phone, a computer, a tablet computer, a wearable smart device, an artificial intelligence device, or a mobile power supply.

\* \* \* \* \*